United States Patent
Ono et al.

(10) Patent No.: US 6,818,284 B2
(45) Date of Patent: Nov. 16, 2004

(54) SINGLE-SIDED PAPER PHENOLIC RESIN COPPER-CLAD LAMINATE WITH BOTH SIDES HAVING RESISTS OF SAME MATERIAL

(75) Inventors: Takaaki Ono, Iwata-gun (JP); Sadayuki Toda, Iwata-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

(21) Appl. No.: 10/068,957

(22) Filed: Feb. 11, 2002

(65) Prior Publication Data

US 2002/0110697 A1 Aug. 15, 2002

(30) Foreign Application Priority Data

Feb. 15, 2001 (JP) ........................................ 2001-038558

(51) Int. Cl.[7] .......................... B32B 15/00; B32B 15/08; B32B 29/00
(52) U.S. Cl. ...................... 428/209; 428/416; 428/464; 428/535; 428/537.5; 428/901
(58) Field of Search ................................ 428/901, 464, 428/416, 535, 537.5, 209, 174, 211.1

(56) References Cited

U.S. PATENT DOCUMENTS

| | | | | |
|---|---|---|---|---|
| 3,526,568 A | * | 9/1970 | Kepple et al. | 428/337 |
| 3,616,984 A | * | 11/1971 | Voroba | 228/33 |
| 3,895,158 A | * | 7/1975 | Gause et al. | 428/220 |
| 4,029,845 A | * | 6/1977 | Nomura | 428/415 |
| 4,302,501 A | * | 11/1981 | Nagashima | 428/209 |
| 4,806,706 A | * | 2/1989 | Machida et al. | 174/250 |
| 4,997,863 A | * | 3/1991 | Ogitani et al. | 523/220 |
| 5,062,896 A | * | 11/1991 | Huang et al. | 106/287.19 |
| 6,459,046 B1 | * | 10/2002 | Ochi et al. | 174/256 |

* cited by examiner

Primary Examiner—Paul Thibodeau
Assistant Examiner—Kevin R. Kruer
(74) Attorney, Agent, or Firm—Oliff & Berridge, PLC

(57) ABSTRACT

In a single-sided paper phenolic resin copper-clad laminate composed of a phenolic resin impregnated paper base having copper foils laminated on and resists applied on the face side thereof, resists formed of the same material as the resists on the face side are applied also on the reverse side of the phenolic resin impregnated paper base, so that the face side and the reverse side match approximately with each other in thermal expansibility. The single-sided paper phenolic resin copper-clad laminate warps only slightly even when the peak temperature is raised to a degree suitable for lead-free solder in the reflow process for mounting electronic components.

8 Claims, 3 Drawing Sheets

SINGLE-SIDED PAPER PHENOLIC RESIN COPPER-CLAD LAMINATE WITH BOTH SIDES HAVING RESISTS OF SAME MATERIAL

BACKGROUND OF THE INVENTION

1. Field of the Invention

The present invention relates to a single-sided paper phenolic resin copper-clad laminate for use in a printed wiring board.

2. Description of the Related Art

As shown in FIG. 4, a single-sided paper phenolic resin copper-clad laminate (hereinafter referred to as "single-sided laminate" for short) 41 of prior art is composed of a phenolic resin impregnated paper base (hereinafter referred to as "paper base") 42 formed by laminating a predetermined number of paper phenolic resins and having copper foils 43 laminated onto a face side of the paper base 42 and resists 44 formed of a synthetic resin such as an epoxy resin and applied to prescribed areas on the face side of the paper base 42.

The single-sided laminate 41 as described above has been increasingly demanded in recent years because of its excellence in electrical and physical characteristics and workability in application for a printed wiring board and also its inexpensiveness.

Lead solder consisting of 63% of tin (Sn) and 37% of lead (Pb) has been used in the past for mounting electronic components on a printed wiring board. To be precise, the eutectic composition thereof consists of 61.9% of Sn and 38.1% of Pb (all the percentages are by mass), but the solder consisting of 63% of Sn and 37% of Pb and having a melting point of 183° C. is usually regarded as eutectic solder.

When electronic components 45 are mounted using this lead solder on the face side of the single-sided laminate 41 shown in FIG. 4, cream solder (lead solder) is applied to the surface of the copper foils 43 laminated on the face side of the paper base 42 using a printer (not shown), then the electronic components 45 are placed by a mounting machine (not shown).

Next, the single-sided laminate 41 having the electronic components 45 mounted thereon is placed on a belt conveyor 52 at an inlet IN of a reflow furnace 51 using both hot air and infrared radiation (shown in FIG. 5), and conveyed into the reflow furnace 51 at a constant speed. During conveyance, the cream solder is melted by infrared radiant heat from a panel heater 53 and hot air from a blower 54 in the reflow furnace 51, and the copper foils 43 of the single-sided laminate 41 and terminals of the electronic components 45 are reflow-soldered to each other, thereby forming solder joints 46. The single-sided laminate 41 which has gone through the reflow furnace 51 is taken out at an outlet OUT of the reflow furnace 51, and the mounting of the electronic components 45 is completed.

FIG. 6 is a temperature profile for evaluation from the inlet IN to the outlet OUT of the reflow furnace 51, and as shown in this figure, the peak temperature Tm in the reflow furnace 51 is about 220° C., which is higher by about 40° C. than the melting point of lead solder (about 180° C.).

The single-sided laminate 41 used for evaluation measures 92×73.3×0.9 mm, and the electronic components 45 are small and do not require large heat capacity.

Under the conditions as described above, the single-sided laminate 41 warped 2.0 mm at most during the reflow process, and it was confirmed that a product having this single-sided laminate 41 mounted causes no problem with quality.

However, in an extremely rare case where large heat capacity is required depending on the size or material of the electronic components 45, the peak temperature Tm in the reflow furnace 51 exceeds 220° C., and the single-sided laminate 41 can warp more than 2.0 mm.

In this case, when the single-sided laminate 41 is screwed onto a product, the single-sided laminate 41 and the solder joints 46 are easily subject to cracking. And, when the peak temperature Tm in the reflow furnace 51 exceeds 245° C., the single-sided laminate 41 undergoes discoloration (scorches) on the reverse side.

Recently, electronic equipments such as OA equipment, communication devices and the like have been developed remarkably. For these electronic equipments, printed wiring boards, on which a lot of electronic components are connected with lead solder, are used. Similar printed wiring boards are employed for many circuits, for example, the control units also in home electric appliances, industrial production machines and so on.

However, electronic equipments, electric appliances and the like (hereafter referred to as "electronic equipments" all together) once produced are to be scrapped. Although scrapped electronic equipments are partly recycled for reuse, most of them are crushed and often buried in the ground without recycling.

Since lead solder contains nearly 40% of lead (Pb) as described above and is toxic to human bodies, animals, plants and the like, it must be duly discarded. Pb in electronic equipments (printed wiring boards) buried in the ground gradually dissolves in acid water such as acid rain, and pollutes soil and groundwater so as to be taken into animals and plants, and further human bodies.

In order to eliminate the pollution against the natural environment and the human bodies, lead-free solder has been developed in recent years. Examples of lead-free solder include Sn—Ag—Cu types, Sn—Ag types, Sn—Cu types, Sn—Sb types, Sn—Zn types and the like.

When any type of these lead-free solders is used in place of lead solder, the heat capacity provided for the single-sided laminate 41 needs to be increased for the reflow process in which the electronic components 45 are mounted on the single-sided laminate 41. This is because the melting point of the lead-free solders is around 210 to 227° C. except some (Sn—Zn types having a low melting point) and higher by approximately 40 to 50° C. than the melting point 183° C. of the conventional lead solder.

Accordingly, the peak temperature Tm in the reflow furnace 51 must be raised to 250 to 260° C., which is about 30 to 40° C. higher than conventionally. The single-sided laminate 41, which does not warp so much as to cause critical problems in the reflow process using the conventional lead solder, warps more than 2.0 mm under the above conditions. Therefore, a product with such a single-sided laminate 41 may have its quality deteriorated, and the improvement in this point has been required.

SUMMARY OF THE INVENTION

The present invention has been made in view of the above needs, and has an object to provide a single-sided paper phenolic resin copper-clad laminate (single-sided laminate) that warps only slightly even when the peak temperature in a reflow furnace is raised to a degree adapted for the melting point of lead-free solder (for example, 255° C.) to enable the reflow process in which lead-free solder is used to mount electronic components.

In order to achieve the above-mentioned object, according to a first aspect of the present invention, in a single-sided laminate composed of a phenolic resin impregnated paper base (paper base) having copper foils laminated on and resists applied on the face side thereof, resists formed of the same material as the resists on the face side are applied on the reverse side of the paper base.

According to a second aspect of the present invention, in the first aspect of the present invention, the resists applied on the reverse side of the paper base are matched with the resists applied on the face side in position and configuration.

DETAILED DESCRIPTION OF THE PREFERRED EMBODIMENTS

Embodiments of the present invention will be illustrated in detail on the basis of the drawings, before which the principle of the present invention is described with reference to FIGS. 2A, 2B and 4.

First of all, the present inventors reviewed a conventional single-sided laminate as follows.

Considering the causes of warp in the conventional single-sided laminate due to heating, it is presumed that most of the causes lie in the structure of the conventional single-sided laminate, although a paper base constituting the conventional single-sided laminate may warp slightly due to heating.

Figure 4:
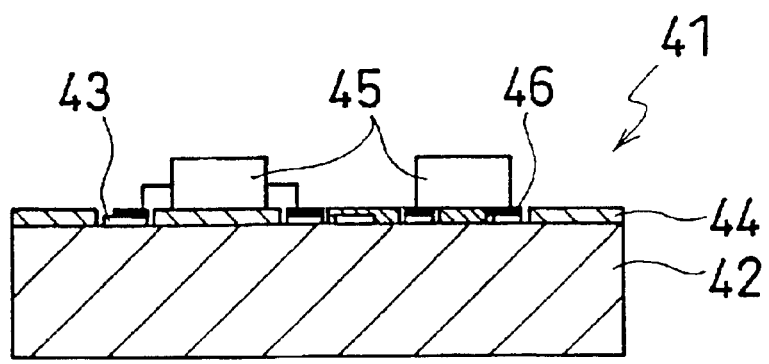
FIG. 4 is a sectional view showing a conventional single-sided laminate on which electronic components are mounted.

A conventional single-sided laminate 41 has copper foils 43 and resists 44 on the face side of a paper base 42, but none on the reverse side as shown in FIG. 4, making the face side and the reverse side asymmetric.

Furthermore, the paper base 42, the copper foils 43 and the resists 44 differ from each other in thermal expansibility/contractibility. Hence the conventional single-sided laminate 41 shown in FIG. 4 is likely to warp with its central portion elevated upwardly due to heating during the reflow process.

The causes of the warp in the conventional single-sided laminate 41 by raising the peak temperature Tm in the reflow furnace 51 are now reviewed based on the results of the measurement using a Fourier transform infrared spectrometer.

Figure 2A:
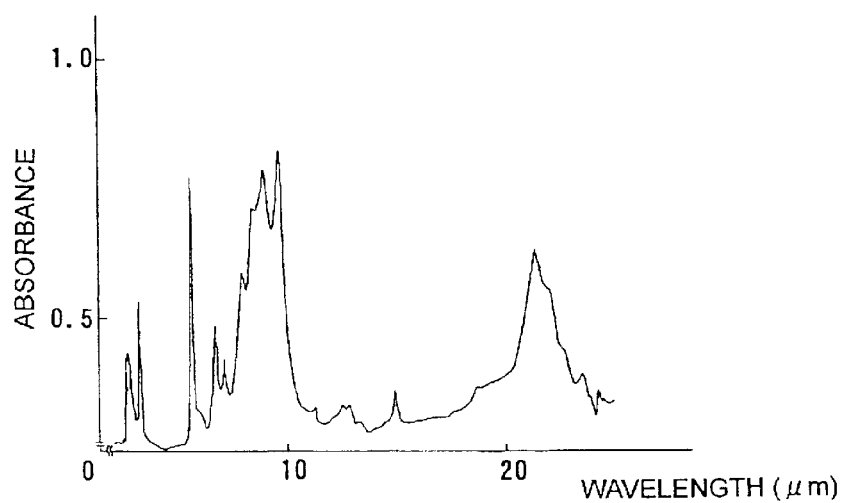
FIGS. 2A and 2B are graphs showing the results of the measurement of infrared absorbance at the face side and the reverse side of a single-sided laminate of prior art.
Figure 2B:
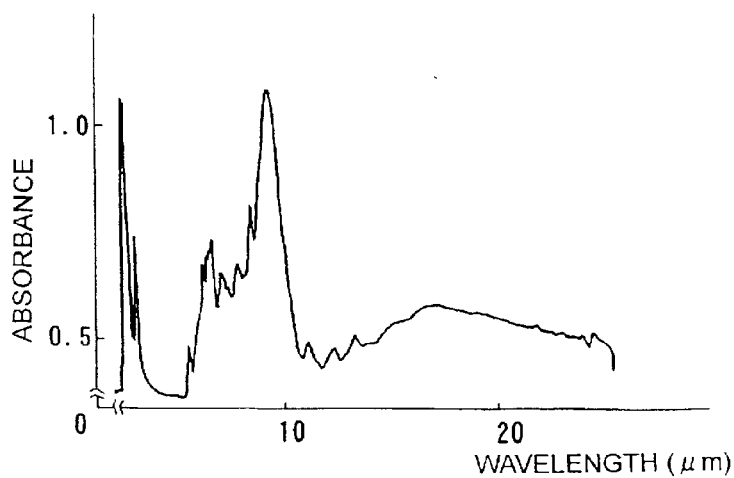

Each infrared absorbance at the resists 44 provided on the face side of the conventional single-sided laminate 41 and at a portion of the reverse side (a portion of the paper base 42) was measured with a Fourier transform infrared spectrometer, and the results shown in FIGS. 2A and 2B, respectively, were obtained.

The absorbance at the resists 44 on the face side of the single-sided laminate 41 was high at the wavelengths of 5.78 $\mu$m and 8.5 to 10 $\mu$m (see FIG. 2A), whereas the absorbance at the portion of the paper base 42 on the reverse side was high at the wavelength 6.5 to 10 $\mu$m (see FIG. 2B).

The peak of the wavelength of the infrared ray radiated from a panel heater 53 in the reflow furnace 51 is calculated from Wien's displacement law which rules that a wavelength $\lambda m$ at which the radiant energy density radiated from a black body having an absolute temperature T is maximum is in inverse proportion to T, and the following formula (1) is valid:

$$\lambda m \cdot T = b \quad (1)$$

where b is ch/$\beta$k, h is Planck constant, c is the velocity of light in a vacuum, $\beta$ is 4.965, and k is Boltzmann constant.

Accordingly, when the peak temperature Tm in the reflow furnace 51 is 255° C., the wavelength $\lambda m$ at which the infrared radiant energy density radiated from the panel heater 53 is maximum is given as follows.

$$\lambda m = 2.8976 \times 10^3/(255+273) \approx 5.49 \ \mu m.$$

Now, the infrared absorptivity in a wavelength band ranging around 5.49 $\mu$m is compared between the face side and the reverse side of the conventional single-sided laminate 41. The results of the measurement of infrared radiation absorbance shown in FIGS. 2A and 2B indicate that the face side provided with the resists 44 absorbs more infrared radiation.

Therefore when the conventional single-sided laminate 41 is heated by the panel heater 53, the face side is heated deeper, whereby the face side is heated to a higher temperature than the reverse side.

Moreover, the thermal expansion coefficient (coefficient of linear expansion) of the resists 44 (epoxy resin portion) constituting the face side is $3.8 \times 10^{-5}/°$ C. and larger than that of the reverse side (paper base 42), that is $1.5 \times 10^{-5}/°$ C.

Accordingly, it is concluded that the conventional single-sided laminate 41 in FIG. 4 warps with its central portion elevated upwardly.

The present inventors have come to the conclusion that the differences in temperature and in thermal expansion coefficient between the face side and the reverse side have to be diminished in order to prevent the conventional single-sided laminate 41 from warping, and made out the present invention.

According to the present invention, the single-sided laminate is structured such that a paper base, that is a phenolic resin impregnated paper base having copper foils laminated on and resists applied on the face side, has resists applied also on the reverse side.

To be most effective, resists formed of the same material and having the same thermal expansion coefficient as the resists on the face side of the single-sided laminate 41 are applied on the reverse side in position and configuration corresponding to the resists on the face side, thereby making the face side and the reverse side symmetrical to each other in terms of resist application.

As a result, the single-sided laminate is symmetrical also in terms of thermal expansibility and does not have any critical difference in temperature and thermal expansion coefficient between the face side and the reverse side thereof, whereby the warp thereof does not exceed 2.0 mm under the same conditions.

Figure 1:
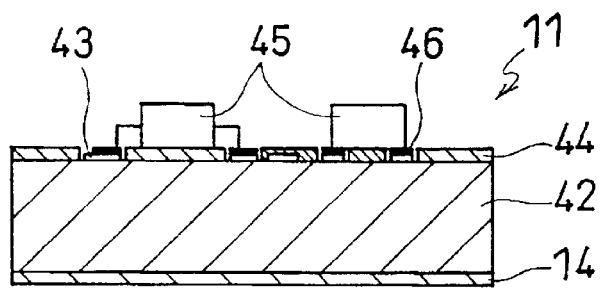
FIG. 1 is a sectional view showing a single-sided laminate in accordance with an embodiment of the present invention on which electronic components are mounted.

FIG. 1 is a sectional view showing a single-sided paper phenolic resin copper-clad laminate (to be called "single-sided laminate") 11 in accordance with an embodiment of the present invention, and the same symbols are used for numerals identical with or equivalent to those shown in FIG. 4.

As can be seen from FIG. 1, the single-sided laminate 11 of the present invention has resists 14 applied on the reverse side of a paper base 42 that constitutes a substrate of the single-sided laminate 11, in other words, on the reverse side of the conventional single-sided laminate 41 shown in FIG. 4. The resists 14 are formed of the same material as the resists 44 applied on the face side of the paper base 42.

Specifically, the paper base 42 has the resists 14 of an epoxy resin applied entirely on the reverse side (postcured at 140° C. for 2 hours) with a thickness of 20 μm identical with that of the resists 44 applied on the face side.

Figure 5:
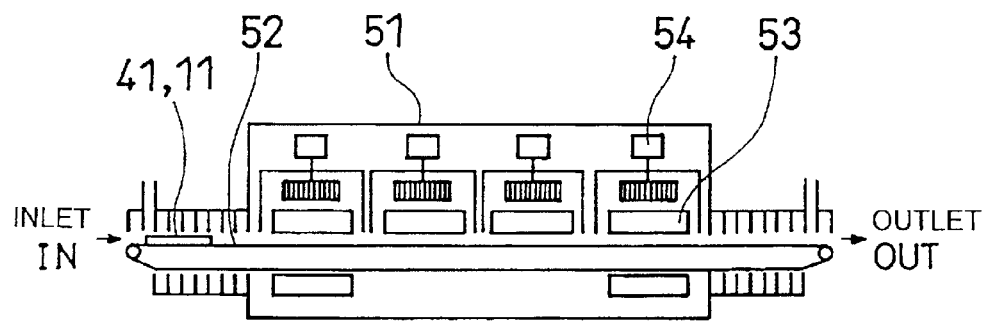
FIG. 5 is a schematic illustration showing the structure of a reflow furnace.
Figure 6:
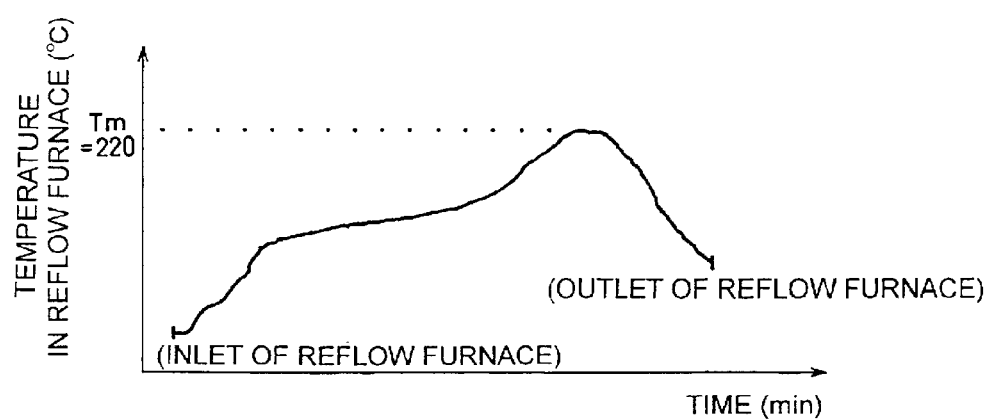
FIG. 6 is a graphical illustration showing a temperature profile in the reflow furnace shown in FIG. 5 from the inlet to the outlet thereof.

Cream solder (lead-free solder) is printed onto the copper foils 43 laminated on the face side of the paper base 42, and electronic components 45 are placed on the cream solder, then the single-sided laminate 11 is conveyed into the reflow furnace 51 for the reflow process (see FIG. 5).

With this, the copper foils 43 of the single-sided laminate 11 and the terminals of the electronic components 45 are reflow-soldered to each other to form solder joints 46, then the single-sided laminate 11 comes out from the reflow furnace 51, completing the process of mounting the electronic components 45.

The single-sided laminate 11 measures 92×73.3×0.9 mm, and is of the same dimension as the conventional single-sided laminate 41 shown in FIG. 4.

Figure 3:
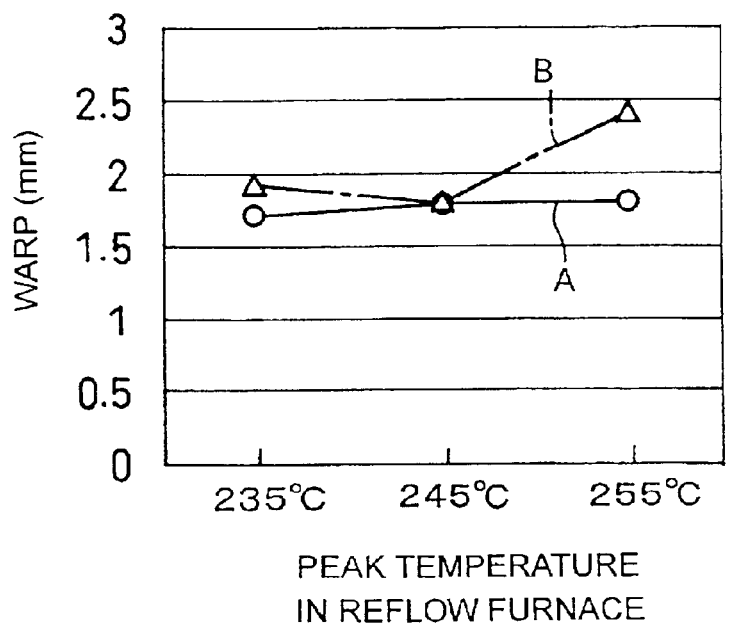
FIG. 3 is a graph showing the result of the measurement of warp suffered in the single-sided laminates of the present invention and the prior art during the reflow process at three peak temperatures in a reflow furnace.

The warp suffered in the single-sided laminate 11 during the reflow process was measured with the peak temperature Tm in the reflow furnace 51 set at 235° C., 245° C. and 255° C., and the result shown by the line A in FIG. 3 was obtained. The line B in FIG. 3 shows the values measured on the warp caused under the same conditions during the reflow process in the conventional single-sided laminate 41 which does not have the resists 14 applied on the reverse side of the paper base 42 (see FIG. 4).

As can be seen from the line B, the conventional single-sided laminate 41 warped about 2.5 mm at a peak temperature Tm of 255° C., thus deteriorating the quality of a product in which the single-sided laminate (printed wiring board) 41 is used.

On the other hand, the single-sided laminate 11 of the present invention met the conditions requiring that a warp suffered at a peak temperature Tm of 255° C. be 2.0 mm maximum, and caused no deterioration in the quality of the product.

Furthermore, in case of the conventional single-sided laminate 41, discoloration (scorches) appeared on the reverse side of the paper base 42 when the peak temperature Tm in the reflow furnace was 245° C. and 255° C. However, in case of the single-sided laminate 11 of the present invention, no discoloration (scorches) appeared on the reverse side of the paper base 42.

In the above embodiment, the resists 14 were applied entirely and solidly on the reverse side of the paper base 42 without matching the position and configuration of the resists 44 applied on the face side, but application of the resists is not limited to this, and the resists may be applied partly, for example with a checkered pattern on the reverse side. This helps save the consumption of the material for the resists 14.

As described in the explanation of the principle, the resists 14 may be applied most effectively in such a manner as to match the position and configuration of the resists 44 applied on the face side. This makes the face side and the reverse side of the single-sided laminate 11 of the present invention symmetrical with each other in terms of thermal expansibility, whereby its warp can be kept to a minimum.

In the single-sided laminate of the present invention, resists of the same material as resists applied on the face side are applied also on the reverse side, and therefore the face side and the reverse side thereof are approximately equal in thermal expansibility.

Accordingly, the present invention ensures that in the reflow process in which lead-free solder is used to mount electronic components, the single-sided laminate is kept from critically warping even when the peak temperature in the reflow furnace is raised to a degree suitable for lead-free solder which is higher than a temperature adapted for lead solder.

What is claimed is:

1. A single-sided paper phenolic resin copper-clad laminate comprising a phenolic resin impregnated paper base having:

copper foils adapted to have terminals of electronic components soldered thereon, the copper foils being directly laminated to said phenolic resin impregnated paper base on a face side of said paper base, and resists applied on the face side, except an area adapted to have the terminals of electronic components soldered on the copper foils, wherein resists formed of a same material as the resists on the face side are applied on a reverse side of the phenolic resin impregnated paper base, and wherein a position and configuration of the resists applied on the reverse side of the phenolic resin impregnated paper base match with those of the resists applied on the face side of the phenolic resin impregnated paper base.

2. A single-sided paper phenolic resin copper-clad laminate as claimed in claim 1, wherein said resist is formed of a synthetic resin.

3. A single-sided paper phenolic resin copper-clad laminate as claimed in claim 2, wherein the synthetic resin is an epoxy resin.

4. A single-sided paper phenolic resin copper-clad laminate as claimed in claim 1, wherein the terminals of electric components are soldered with lead-free solder.

5. A single-sided paper phenolic resin copper-clad laminate comprising a phenolic resin impregnated paper or base having:

copper foils adapted to have terminals of electronic components soldered thereon, the copper foils being directly laminated to said phenolic resin impregnated paper base on a face side of said paper base, and resists applied on the face side, except an area adapted to have the terminals of electronic components soldered on the copper foils, wherein resists formed of a same material as the resists on the face side are applied on a reverse side of the phenolic resin impregnated paper base, and wherein the resists applied on the reverse side of the phenolic resin impregnated paper base are applied with a checkered pattern.

6. A single-sided paper phenolic resin copper-clad laminate as claimed in claim 5, wherein said resist is formed of a synthetic resin.

7. A single-sided paper phenolic resin copper-clad laminate as claimed in claim 6, wherein the synthetic resin is an epoxy resin.

8. A single-sided paper phenolic resin copper-clad laminate as claimed in claim 5, wherein the terminals of electric components are soldered with lead-free solder.

* * * * *